United States Patent [19]
Arinaga et al.

[11] Patent Number: 5,196,692
[45] Date of Patent: Mar. 23, 1993

[54] PHOTOELECTRIC TRANSDUCER SWITCHABLE TO A HIGH-RESOLUTION OR HIGH-SENSITIVITY MODE

[75] Inventors: Kenji Arinaga; Nobuyuki Kajihara; Gen Sudo; Koji Fujiwara; Soichiro Hikida; Yuichiro Ito, all of Kawasaki, Japan

[73] Assignee: Fujitsu Limited, Kawasaki, Japan

[21] Appl. No.: 825,497

[22] Filed: Jan. 24, 1992

[30] Foreign Application Priority Data

Feb. 1, 1991 [JP] Japan .................. 3-12058

[51] Int. Cl.⁵ .................. H01J 40/14; H01L 27/14
[52] U.S. Cl. .................. 250/208.1; 250/214.1; 257/431
[58] Field of Search .................. 250/208.2, 208.1, 211 J, 250/211 R; 357/30 D, 30 H, 30 P, 30 Q, 32

[56] References Cited

U.S. PATENT DOCUMENTS

| | | | |
|---|---|---|---|
| 3,703,669 | 11/1972 | London | 317/235 R |
| 4,369,372 | 1/1983 | Yoshioka et al. | 250/208.1 |
| 4,531,055 | 7/1985 | Shepherd, Jr. et al. | 250/211 J |
| 4,751,560 | 6/1988 | Rosbeck | 357/32 |
| 4,796,072 | 1/1989 | Higashi et al. | 250/208.1 |

FOREIGN PATENT DOCUMENTS

| | | |
|---|---|---|
| 0086628 | 8/1983 | European Pat. Off. |
| 2450012 | 9/1980 | France |
| 57-12571 | 1/1982 | Japan |

OTHER PUBLICATIONS

N. Kadekodi et al., "A Polysilicon Isolated Photodiode Array Imager," International Electron Devices Meeting, Dec. 7-9, 1981, pp. 483-486.

Patent Abstracts of Japan, vol. 6, No. 72 (E-105) May 1982 and JP-A-57 012571 dated Jan. 22, 1982.

Primary Examiner—David C. Nelms
Assistant Examiner—John R. Lee
Attorney, Agent, or Firm—Staas & Halsey

[57] ABSTRACT

A photoelectric transducer having a photocell includes a compound semiconductor substrate in which a photodiode is doped by an impurity of a conductivity type opposite to that of the substrate. An enclosure region is formed by the same doping impurity as the photodiode, surrounding but spaced apart from the photodiode. A gate electrode is formed on a portion of an insulation layer, the latter formed all over the substrate surface, which extends between the photodiode and the enclosure region. The enclosure region is selectively connected, via a contact hole through the insulation layer and a first switch to ground level. The gate electrode is connected via a second switch to a predetermined voltage having the same polarity as the conductivity type of the substrate. In a high-resolution mode, the first switch is closed and the second switch is open, so that the grounded enclosure region prevents carriers generated in the substrate, between the photodiode and the enclosure region, from flowing into an adjacent cell. In a high-sensitivity mode, the first switch is opened and the second switch is closed, so that the gate voltage generates a channel which electrically connects the photodiode to the enclosure region; thus, the carriers generated within the enclosure are all gathered to the photodiode. The first and second switches may be fabricated on a second semiconductor substrate, arranged parallel to but spaced from the compound semiconductor substrate and electrically connected thereto via bumps.

8 Claims, 6 Drawing Sheets

PHOTOELECTRIC TRANSDUCER SWITCHABLE TO A HIGH-RESOLUTION OR HIGH-SENSITIVITY MODE

BACKGROUND OF THE INVENTION

1. Field of the Invention

This invention relates to a photoelectric transducer switchable to a high-sensitivity or high-resolution mode.

2. Description of the Related Arts

In a photovoltaic type photoelectric transducer device which provides a high sensitivity particularly in infrared light detection, a compound semiconductor substrate having a narrow energy band gap, such as HgCdTe (mercury-cadnium-tellurium) is doped with impurity atoms so that photodiodes are formed, with a patterned of conductive layer having a conductivity type opposite to that of the substrate. In this type of photoelectric transducer device, the photocells are integrated on a single substrate as dense as possible in order to achieve a high resolution of light detection. Accordingly, the dense integration of the photocells has caused problems of cross-talk between signals generated in adjacent photocells, resulting in a deterioration of the resolution of the image detected thereby.

In order to solve the problem, there has been proposed a structure shown in FIG. 1, in which a CdTe substrate 2 is provided with ditches 1 at a predetermined pitch, and a crystal layer 3 is formed of, for example, an epitaxial growth of p-type $Hg_{1-x}Cd_xTe$ upon the substrate. A photodiode 5 is formed of a pn junction having an $n^+$ layer 4 doped with an impurity of a conductivity type opposite to the conductivity type of $Hg_{1-x}Cd_xTe$ crystal layer 3. A plurality of photodiodes 5 are formed over the portion excluding ditches 1 of substrate 2. Carriers generated by an infrared light A' input to ditch 1 are trapped in the thick portion of the $Hg_{1-x}Cd_xTe$ crystal layer 3 in the ditch 1, on the way to reaching a nearby pn junction. The thus trapped carriers prevent crosstalk between signals detected in the adjacent photodiodes 5. However, trapping of the carriers causes deterioration of the detection sensitivity of the photodiodes.

SUMMARY OF THE INVENTION

It is a general object of the invention to provide a photoelectric transducer which can select a mode of either high resolution or high sensitivity.

A photocell of the photoelectric transducer of the present invention comprises a photodiode region doped with an impurity of a conductivity type opposite to that of the compound semiconductor substrate of the photoelectric transducer. An enclosure region is formed by the same doping impurity as that in the photodiode region, surrounding and spaced apart from the photodiode region. A gate electrode is provided, on an insulation layer formed all over the surface of the photodiode and the enclosure, over a portion thereof between the photodiode and the enclosure region. The enclosure region is selectively connected, via a contact hole through the insulation layer to a first switch to a ground level. The gate electrode is selectively connected, via a second switch, to a predetermined voltage whose polarity is the same as the conductivity type of the compound semiconductor substrate. In a high-resolution mode, the first switch is closed and the second switch is open, so that the grounded enclosure prevents carriers generated in the substrate between the photodiode and the enclosure region, from flowing into an adjacent cell. In a high-sensitivity mode, the first switch is open and the second switch is closed, so that the gate voltage generates a channel which electrically connects the photodiode to the enclosure region, so that the carriers generated within the enclosure are all gathered to the photodiode. The first and second switches may be fabricated on a second semiconductor substrate arranged parallel to but spaced from the compound semiconductor substrate. The second substrate is electrically connected via bumps to the photodiode, the gate electrode and the enclosure region.

The above-mentioned features and advantages of the present invention, together with other objects and advantages, which will become apparent, will be more fully described hereinafter, with reference being made to the accompanying drawings which form a part hereof, wherein like numerals refer to like parts throughout.

A BRIEF DESCRIPTION OF THE DRAWINGS

FIG. 1 schematically illustrates a prior art photoelectric transducer;

FIGS. 2(a) and 2(b) schematically illustrate the principle of the present invention, in which FIG. 2(b) is a cross-sectional view in a plane cut along line 2(b)—2(b) of FIG. 2(a) plan view;

FIGS. 3(a) and 3(b) schematically illustrate the function of the present invention;

FIGS. 4(a) to 4(d) illustrate a preferred embodiment of the present invention, in which FIGS. 4(b) to 4(d) are cross-sectional views in respective planes cut along lines 4(b)—4(b), 4(c)—4(c), and 4(d)—4(d) of FIG. 4(a), FIG. 5 schematically illustrates a plan view of a layout of multiple photocells of the present invention; and FIG. 8 is a graph to show the effect of the enclosure region of the present invention.

DESCRIPTION OF THE PREFERRED EMBODIMENT

Figure 1:
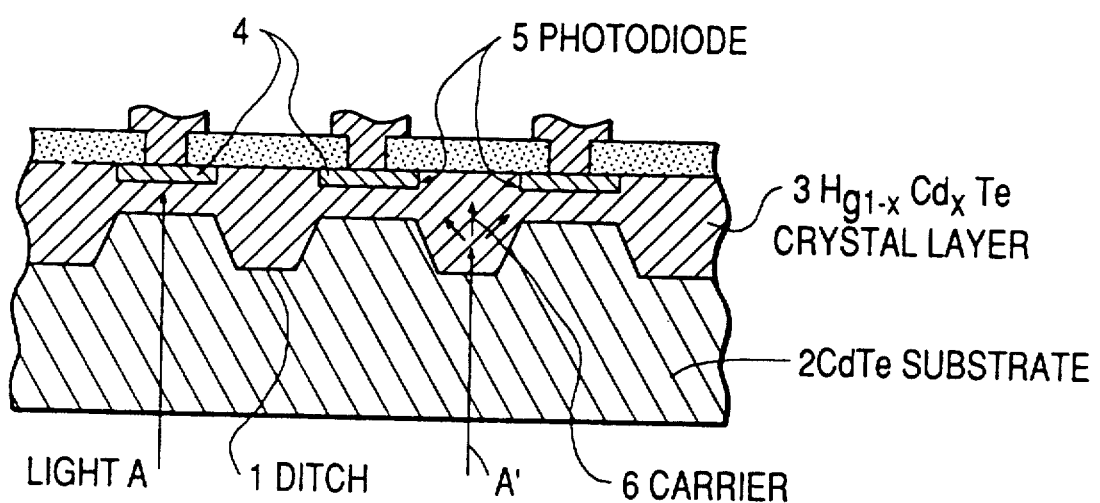
Figure 2A:
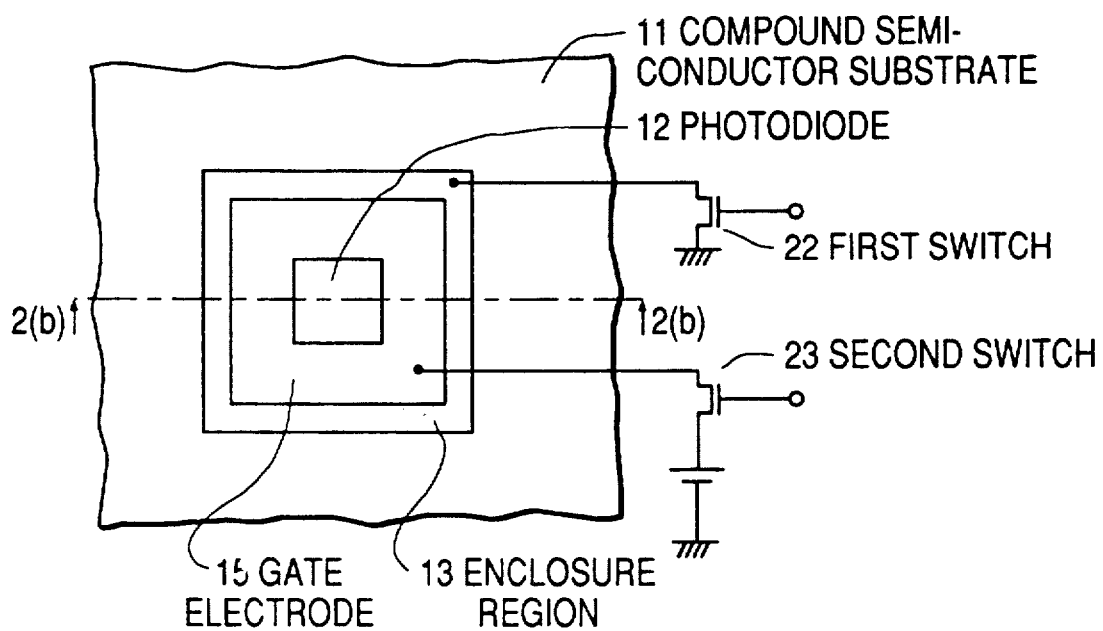
Figure 2B:
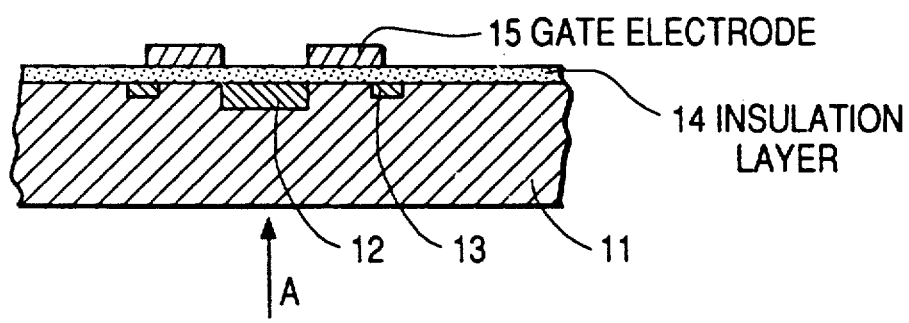

Referring to FIGS. 2(a) and 2(b), in which where a single photocell is representatively illustrated, the principle of the present invention is hereinafter described. Into a predetermined island-shape surface portion of a substrate 11 formed of, for example, p-type PbSnTe (lead-tin-tellurium) compound semiconductor, In (indium) atoms, which are of n-type, are doped so as to form a photodiode 12. A predetermined enclosure region 13, surrounding but spaced apart from the island 12 on the substrate surface, is also doped with the In atoms. An insulation layer 14 typically of ZnS (zinc sulfide) is formed upon the surface of substrate 11 having the thus doped regions 12 and 13. Upon insulation layer 14 a gate electrode 15 is formed so as to cover the portion of the surface of substrate 11 in between photodiode 12 and enclosure region 13. An infrared light A to be detected is input from the bottom of substrate 11.

Lead-out wirings from photo diode 12 and from substrate 11 are not shown in FIGS. 2. Enclosure region 13 is lead out through insulation layer 14 via a first switch 22 to ground 21. Gate electrode 15 is connected via a second switch 23 to a positive DC (direct current) voltage source.

Figure 3A:
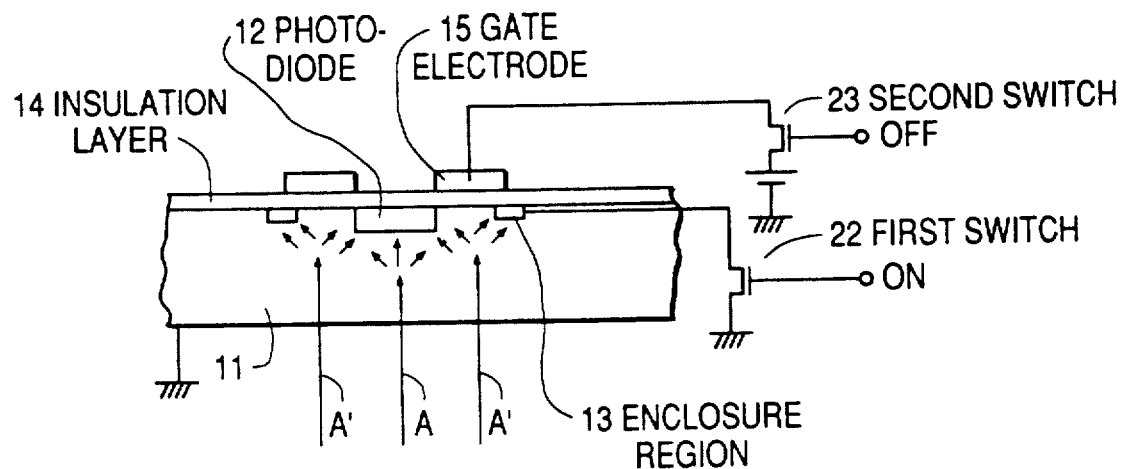
Figure 3B:
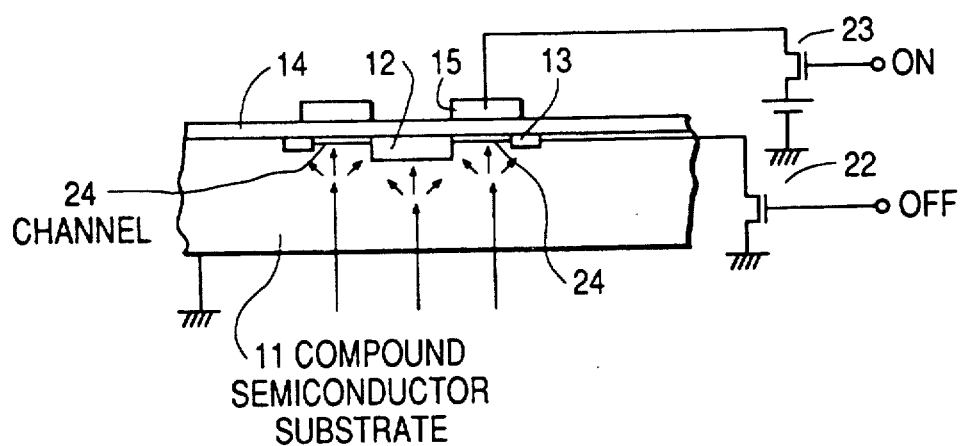
Figure 4A:
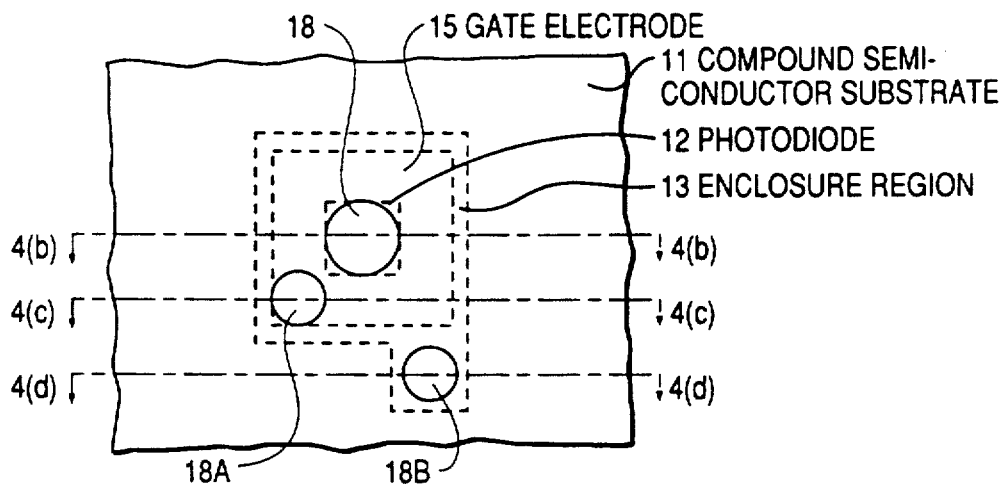
Figure 4B:
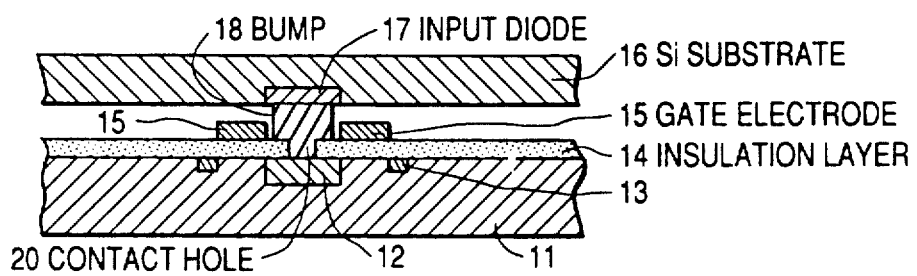
Figure 4C:
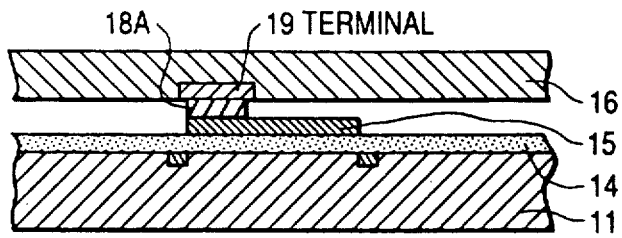
Figure 4D:
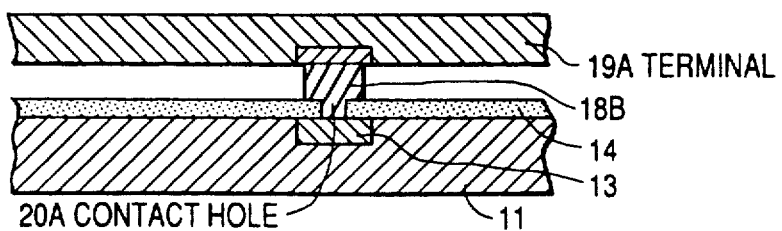

Referring to FIGS. 3(a) and 3(b), operation of the photocell of FIGS. 2a) and 2(b) is hereinafter described. When a high resolution mode is required, first switch 22 is closed ("ON") so as to make enclosure region 13 grounded and second switch 23 is opened ("OFF") so as to make gate electrode 15 floating as shown in FIG. 3(a). Carriers generated in the vicinity of enclosure region 13 are attracted and absorbed by the junction potential of enclosure region 13. The movement of the carriers are illustrated with small arrows in FIGS. 3. Thus, no carriers flow into adjacent photodiodes, which are not shown in the figure, causing no crosstalk between the adjacent photo cells. Then, a decrease in the amount of carriers detected by photo diode 12 cannot be helped, due to the fact that some of the carriers generated in between the photodiode and the enclosure are absorbed by the enclosure.

When a high sensitivity mode is required, first switch 22 is opened ("OFF") so as to make enclosure 13 floating and second switch 23 is closed ("ON") so as to apply a positive voltage onto gate electrode 15, as shown in FIG. 3(b). Due to the positive voltage of the gate electrode 15, the surface of substrate 11 beneath the gate electrode 15 is inverted to n-type so as to form a channel 24. Channel 24 electrically connects the enclosure region 13 to the photodiode 12. Accordingly, all the carriers generated within enclosure region 13 are gathered by the photo diode 12. Thus, the high sensitivity detection is accomplished.

Referring to FIGS. 4(a) to 4(d), a preferred embodiment of the present invention is hereinafter described in detail. Into a surface of a substrate 11 formed of, for example, a p-type PbSnTe (lead-tin-tellurium) compound semiconductor, In (indium) atoms are doped by thermal diffusion to preferably by ion implantation, for example, as much as $10^{17}$/cm$^3$ to $10^{18}$/cm$^3$, and 1 μm deep so as to form a photodiode 12 and enclosure region 13. Photodiode 12 is typically 20 μm square. Enclosure region 13 is of almost square walls, for example, 40 μm square, 3 μm width and 1 μm deep, surrounding but spaced apart from photodiode 12. An insulation layer 14 typically of ZnS (zinc sulfide) is sputtered all over the surface of substrate 11 having the thus doped portions 12 and 13, typically as thick as 0.5 μm. Upon insulation layer 14 a gate electrode 15 typically of gold is patterned according to conventional sputtering and lithography techniques so as to substantially cover the portion of the surface of insulation layer 14 (and of the underlying surface of the substrate 11) in between photodiode 12 and enclosure 13. Contact holes 20 and 20A are opened, through insulation layer 14, over predetermined portions of photodiode 12 and enclosure region 13, respectively. Bumps 18, 18A and 18B of conductive material are provided through contact holes 20 and 20A as well as on gate electrode 15. First and second switches 22 and 23, each typically formed of a MOS FET (metal-oxide-semiconductor field-effect-transistor), and an electronic circuit for processing output signals from the photodiode 12, such as a CCD (charge-coupled device) circuit, are fabricated on a silicon substrate 16, according to conventionally known techniques. On a surface of silicon substrate 16, an input diode 17 and terminals 19 and 19A are provided. Input diode 17 is formed by typically doping P (phosphorus) into silicon substrate 16, which is of n-type silicon. Terminals 19 and 19A are typically formed by deposition of a metal, such as aluminum. The silicon substrate surface having the terminals is pressed onto the compound semiconductor substrate 11 so that input diode 17 and terminals 19 and 19A are cold-welded to bumps 18, 18A and 18B, respectively, according to a conventionally known technique.

Through in the above explanation and figures it is described that gate electrode 15 covers the portion in between photo diodes 12 and enclosure region 13, the width of gate electrode is not strictly required to be equal to the width of the gap between gate electrode and the enclosure. A gate electrode wider than the gap causes no problem. If the gate electrode width is smaller than the gap, an increased electrode voltage can expand the width of the channel generated therebeneath until the channel reaches both the photo diode 12 and the enclosure 13.

Figure 6:
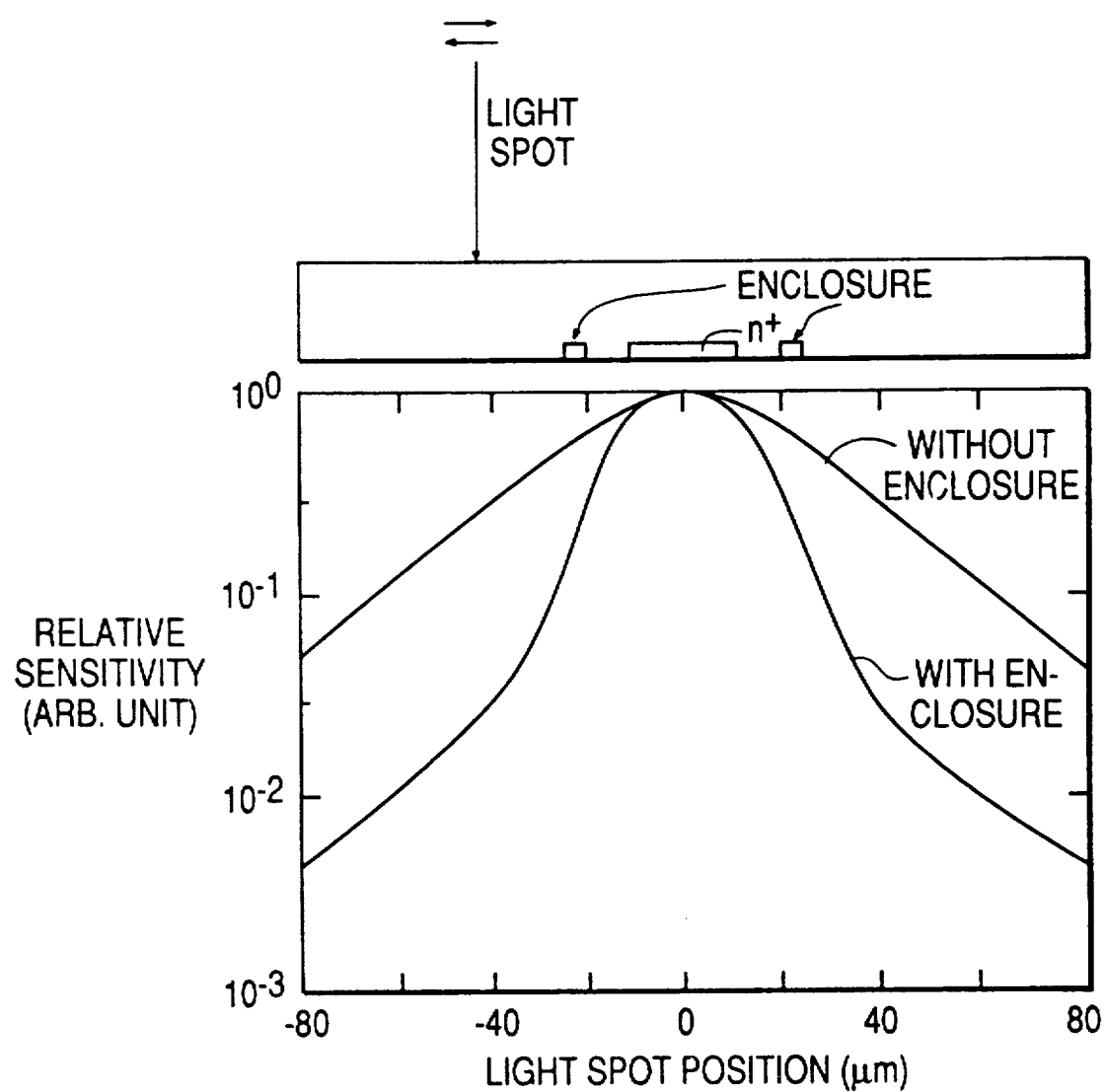

Reduction of the crosstalk by the existence of the enclosure is shown in FIG. 6. The abscissa indicates the position of a light spot injected onto a sample substrate having a single photoelectric cell of dimensions of the above-described preferred embodiment, as drawn at the top of the graph. The ordinate indicates relative sensitivity in arbitrary units, for example, the output current of the photodiode. It is observed from the graph that the enclosure decreases the amount of carriers caught in the adjacent cell area down to almost one tenth of the amount of the case having not enclosure.

Though in the above description the enclosure region is grounded by the first switch, the ground level may be replaced with an arbitrary proper voltage other than the ground level, as long as the enclosure region prevents the carriers from flowing into the adjacent cell. The voltage to be applied to gate electrode 15 is typically + 1 volt for the case of the above-described preferred embodiment.

Figure 5:
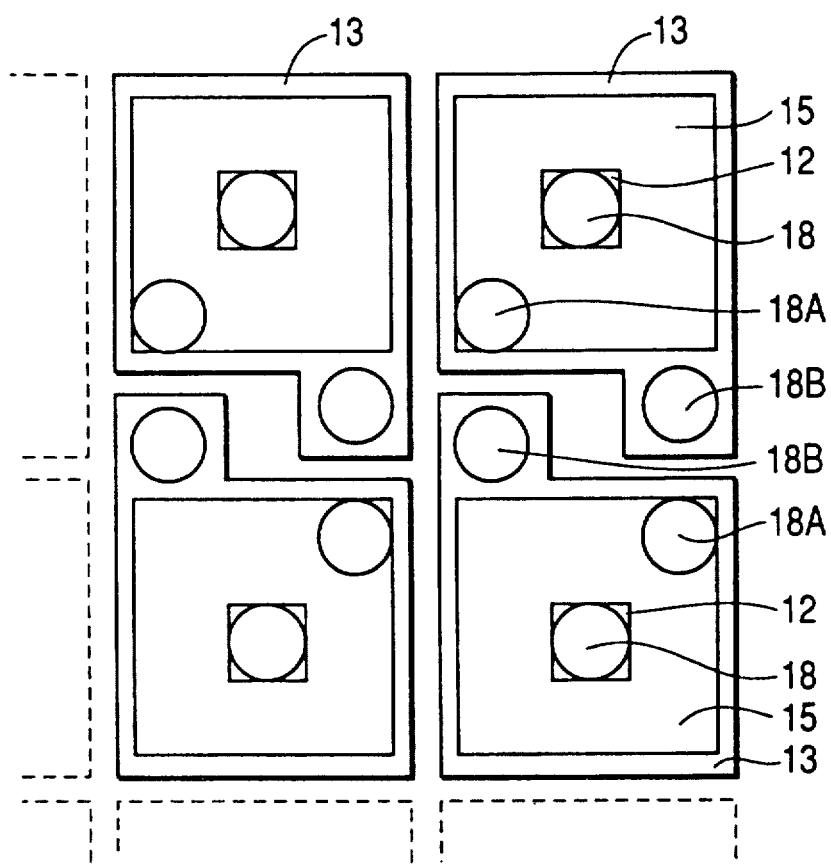

A plurality of photocells as shown in FIGS. 4 are integrated as typically shown in FIG. 5. Each of enclosure regions 13 is independently provided with the first switch 22 (i.e., FIGS. 3(a) and 3(b)). All of the gate electrodes 23 are commonly connected to a single second switch 23.

Though in FIG. 5 the photocells are arranged in a two-dimensional layout, it is apparent that the present invention can be applied to a photoelectric transducer having linearly arranged multiple photocells. In the linear arrangement, the sides of enclosure region facing the sides of the linear arrangement may be omitted, while the enclosure regions at the sides thereof which are between, and thus are facing, adjacent photocells are remaining as linear fences.

Though in FIGS. 2 and 3 the shape of the enclosures are essentially square, it is apparent that the shape may be arbitrarily chosen to be other than square, based upon design requirements.

Though in the above description, the material of compound semiconductor is referred to as p-type PbSnTe, it is apparent that the present invention may be applied to a photoelectric device whose substrate is formed of InSb (indium-antimony), HgCdTe (mercury-cadnium-tellurium) or HgZnTe (mercury-zinc-tellurium).

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, the is not limited to the detailed disclosure herein and accordingly, all suitable modifications are equivalents may be resorted to, falling within the scope of the invention.

What we claim is:

1. A photoelectric transducer having a photocell, comprising:
   a compound semiconductor substrate of a first conductivity type and having a main surface;
   a photodiode region, doped with an impurity of a second conductivity type opposite to said first conductivity type, formed on the main surface of said compound semiconductor substrate;
   an enclosure region, surrounding and separated from said photodiode region and doped with an impurity of said second conductivity type, formed on said main surface of said compound semiconductor substrate;
   an insulation layer formed on said main surface;
   a gate electrode formed on said insulation layer and located over a portion thereof extending between said photodiode region and said enclosure region;
   a first switch for applying a first predetermined voltage to said enclosure region; and
   a second switch for applying a second predetermined voltage to said gate electrode, said second switch being closed when said first switch is opened and said second switch being opened when said first switch is closed.

2. A photoelectric transducer as recited in claim 1, wherein said first predetermined voltage is the voltage level of said compound semiconductor substrate.

3. A photoelectric transducer as recited in claim 1, wherein the polarity of said second predetermined voltage is identical to the polarity of said first conductivity type.

4. A photoelectric transducer as recited in claim 1, wherein the material of said compound semiconductor substrate is selected from the group consisting of PbSnTe (lead-antimony-tellurium) InSb (indium-antimony), HgCdTe (mercury-cadnium-tellurium) and HgZnTe (mercury-zinc-tellurium), and wherein the light to be detected is an infrared light.

5. A photoelectric transducer as recited in claim 1, further comprising a plurality of said photocells formed on a common, said compound semiconductor substrate.

6. A photoelectric transducer as recited in claim 5, wherein said photocells are linearly arranged.

7. A photoelectric transducer as recited in claim 5, wherein said photocells are two-dimensionally arranged.

8. A photoelectric transducer as recited in claim 1, further comprising a second semiconductor substrate having a main surface and which carries said first and second switches and a circuit which processes a signal detected by said photocell, said second semiconductor substrate being arranged with the main surface thereof in parallel and spaced relationship relatively to the main surface of said compound semiconductor substrate, and said second semiconductor substrate being electrically connected to said photodiode region, said enclosure region and said gate electrode via respective bumps of conductive material.

* * * * *

UNITED STATES PATENT AND TRADEMARK OFFICE
CERTIFICATE OF CORRECTION

PATENT NO. : 5,196,692
DATED : March 23, 1993
INVENTOR(S) : Kenji ARINAGA et al.

It is certified that error appears in the above-indentified patent and that said Letters Patent is hereby corrected as shown below:

Col. 1,　line 16, change "cadnium" to --cadmium--;
　　　　　line 18, delete "of";
　　　　　line 62, after "layer" insert --,--.

Col. 2,　line 1, after "substrate" insert --,--;
　　　　　line 28, after "of" insert --the--.

Col. 3,　line 33, delete "to";
　　　　　line 34, after "example," insert --to--.

Col. 4,　line 24, change "not" to --no--;
　　　　　line 27, after "arbitrary" insert --,--;
　　　　　line 57, change "cadnium" to --cadmium--;
　　　　　line 67, change "are" to --or--.

Col. 6,　line 7, change "cadnium" to --cadmium--.

Signed and Sealed this

Ninth Day of August, 1994

Attest:

Attesting Officer

BRUCE LEHMAN
Commissioner of Patents and Trademarks